(12) United States Patent
Hui et al.

(10) Patent No.: US 6,514,849 B1
(45) Date of Patent: Feb. 4, 2003

(54) METHOD OF FORMING SMALLER CONTACT SIZE USING A SPACER HARD MASK

(75) Inventors: Angela T. Hui, Fremont, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 09/824,420

(22) Filed: Apr. 2, 2001

(51) Int. Cl.[7] .......................................... H01L 21/4763
(52) U.S. Cl. ..................... 438/618; 438/636; 438/637
(58) Field of Search ............................... 438/618–622, 438/629, 636–640, 597

(56) References Cited

U.S. PATENT DOCUMENTS 6,214,747 B1 * 4/2001 Chou et al. ................. 438/780

* cited by examiner

Primary Examiner—Jey Tsai
(74) Attorney, Agent, or Firm—Foley & Lardner

(57) ABSTRACT

An exemplary method of forming contact holes includes providing a photoresist pattern over an anti-reflective coating (ARC) layer where the ARC layer is deposited over a layer of material; etching the ARC layer according to the photoresist pattern to form ARC features; forming spacers on lateral sides of the ARC features; and etching trench lines using the spacers and ARC features as hard mask to define portions of the layer of material which are etched.

13 Claims, 3 Drawing Sheets

METHOD OF FORMING SMALLER CONTACT SIZE USING A SPACER HARD MASK

CROSS REFERENCE TO RELATED APPLICATIONS

This application is related to U.S. application Ser. No. 09/597,624, entitled PROCESS FOR FORMING GATE CONDUCTORS, and U.S. patent application Ser. No. 09/597,598 entitled A PROCESS FOR FORMING MULTIPLE ACTIVE LINES AND GATE-ALL-AROUND MOSFET, both of which were filed on Jun. 20, 2000, by Yu and are assigned to the same assignee as the present application. This application is also related to U.S. patent application Ser. No. 09/824,415, entitled METHOD OF FORMING SMALLER TRENCH LINE WIDTH USING A SPACER HARD MASK, filed by Hui et al. on the same day and assigned to the same assignee as this application.

FIELD OF THE INVENTION

The present invention relates generally to the field of integrated circuits and to methods of manufacturing integrated circuits. More particularly, the present invention relates to a method of forming the contact using a spacer hard mask.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Thus, there is a need to pattern IC devices using non-conventional lithographic techniques. Further, there is a need to form smaller feature sizes, such as, smaller trench lines. Yet further, there is a need to form the contact using a spacer hard mask.

SUMMARY OF THE INVENTION

An exemplary embodiment is related to a method of forming a contact in an integrated circuit. This method can include providing a photoresist pattern over an anti-reflective coating (ARC) layer where the ARC layer is deposited over a layer of material; etching the ARC layer according to the photoresist pattern to form ARC features; forming spacers on lateral sides of the ARC features; and etching a contact hole using the spacers and ARC features as hard mask to define portions of the layer of material which are etched.

Briefly, another exemplary embodiment is related to a method of manufacturing an integrated circuit. This method can include patterning mask features on an anti-reflective coating (ARC) layer where the mask features are separated by a first distance defined as a first critical dimension; transferring the patterned mask features to the ARC layer to form ARC features; depositing a layer of spacer material over the ARC features; etching the layer of spacer material to form spacers on lateral sides of the ARC features where the spacers and ARC features define re-structured ARC features; and etching contact holes using re-structured ARC features as a hard mask. The re-structured ARC features are separated by a second distance defined as a second critical dimension. The second critical dimension is less than the first critical dimension.

Briefly, another embodiment is related to an integrated circuit having trench lines. This integrated circuit is manufactured by a method that can include providing a photoresist pattern over an anti-reflective coating (ARC) layer where the ARC layer is deposited over a layer of material; etching the ARC layer according to the photoresist pattern to form ARC features; forming spacers on lateral sides of the ARC features; and etching contact holes using the spacers and ARC features as hard mask to define portions of the layer of material which are etched.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
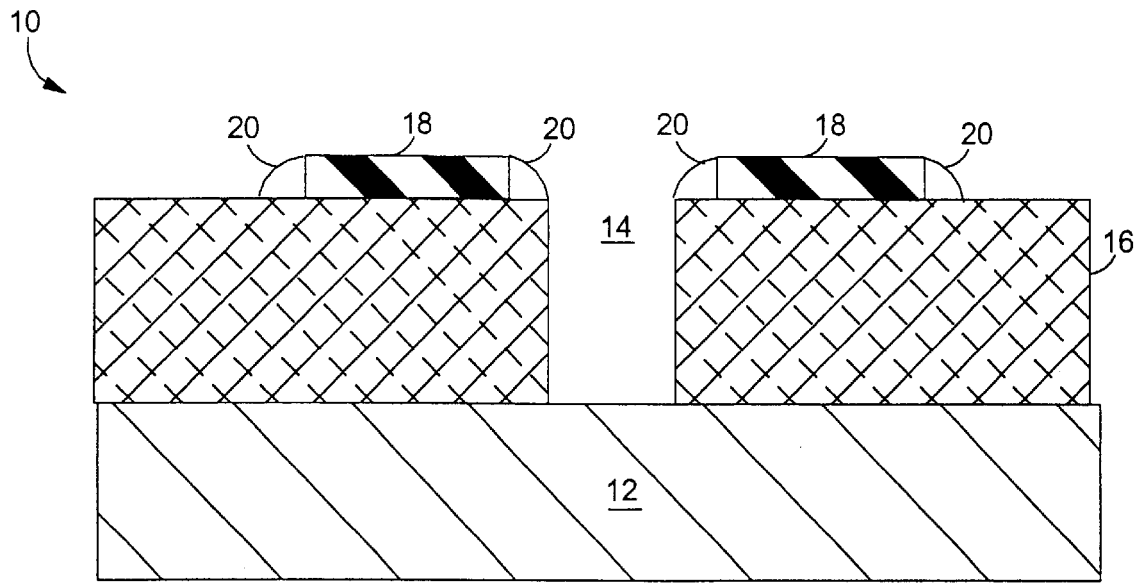
FIG. 1 is a cross-sectional view of a portion of an integrated circuit fabricated in accordance with an exemplary embodiment.

Referring to FIG. 1, a cross-sectional view of a portion 10 of an integrated circuit (IC) includes a substrate 12, a contact hole 14, dielectric layers 16, patterned anti-reflective coating (ARC) features 18, and spacers 20. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is preferably single crystal silicon material or a silicided substrate, such as, $Ni_xSi_y$ or $Co_xSi_y$. Contact hole 14 extends the width of dielectric layers 16 and can be filled with an electrically conductive material. Dielectric layers 16 can include oxide, or any material with a low dielectric constant k. ARC features 18 can be silicon nitride ($Si_3N_4$), silicon oxynitride (SiON), or any other suitable material having appropriate anti-reflective properties. ARC features 18 are located on top of dielectric layers 16. The width between ARC features 18 is preferably one minimum lithographic feature.

Spacers 20 can be any dielectric material, such as, silicon nitride, silicon oxynitride, and silicon rich nitride, and are located abutting lateral sides of ARC features 18. Advantageously, spacers 20 decrease the space or length to be etched in the creation of contact hole 14. As such, contact hole 14 has a narrower width than the critical dimension possible using conventional lithographic techniques. In an exemplary embodiment, contact hole 14 has a width of 1600 to 2500 Angstroms. In an alternative embodiment, contact hole 14 can have a width less than 400–1300 Angstroms.

Figure 2:
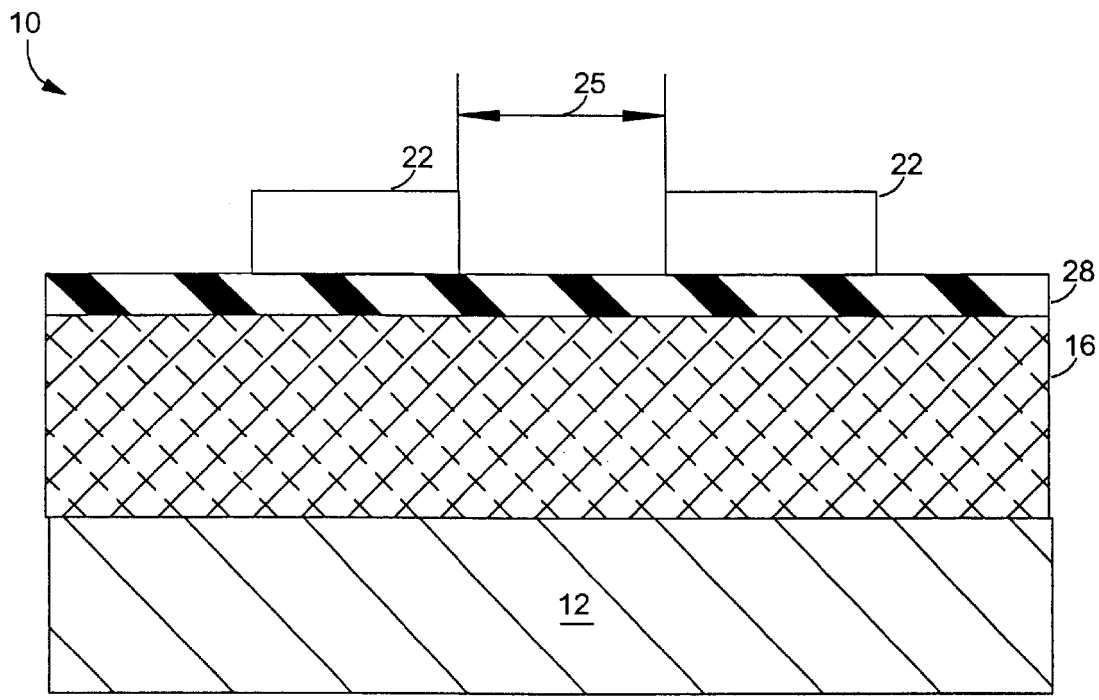
FIG. 2 is a cross-sectional view of a portion of an integrated circuit, showing a patterning step used in an exemplary method of manufacturing the integrated circuit illustrated in FIG. 1.

The method of forming portion 10 is described below with reference to FIGS. 1–5. The method advantageously forms portion 10 having a contact hole with small critical dimensions. In FIG. 2, a cross-sectional view of portion 10 illustrates photoresist features 22, an ARC layer 28, dielectric layers 16, and substrate 12. Photoresist features 22 have been patterned with a standard feature critical dimension 25. In an exemplary embodiment, standard feature critical dimension 25 is 1600 to 2500 Angstroms. In an exemplary embodiment, photoresist features 22 are created in a lithographic process. Photoresist features 22 are used to transfer the pattern of standard feature critical dimension 25 to ARC layer 28. ARC layer 28 is etched with this pattern and photoresist features 22 are stripped. In one embodiment, ARC layer 28 is 300 to 1000 Angstroms (Å) thick, and dielectric layers 16 are 5,000 to 12,000 Angstroms thick. In alternative embodiments, additional layers may also be present in portion 10.

Figure 3:
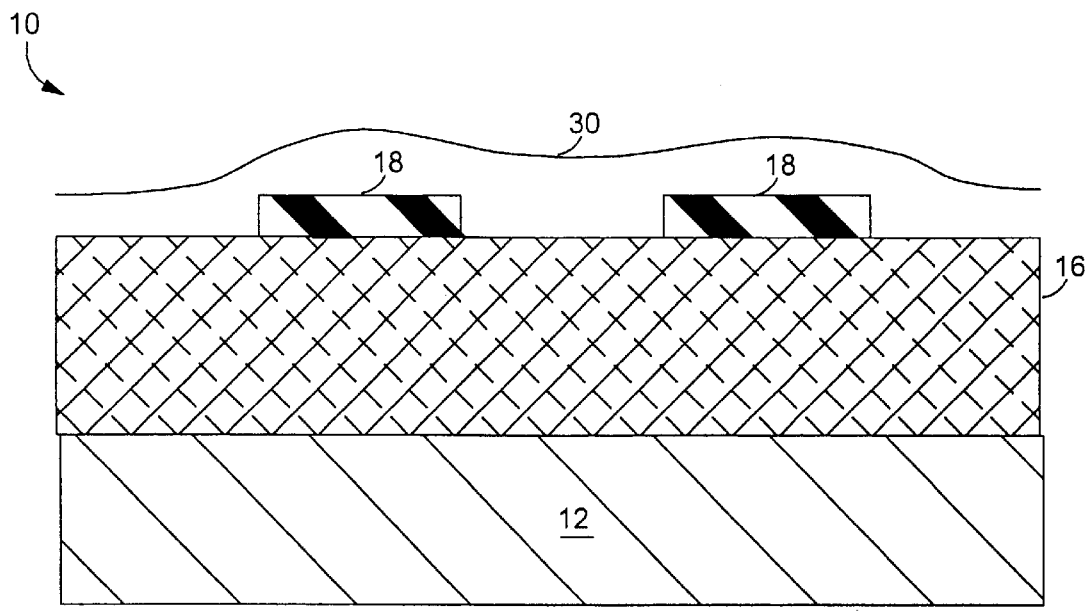
FIG. 3 is a cross-sectional view of a portion of an integrated circuit, showing a spacer creation step used in an exemplary method of manufacturing the integrated circuit illustrated in FIG. 1.

In FIG. 3, a cross-sectional view of portion 10 illustrates that ARC layer 28 (FIG. 2) has been etched to form ARC features 18. A thin film layer 30 is deposited over ARC features 18. In an exemplary embodiment, thin film layer 30 is silicon nitride ($Si_3N_4$), silicon oxynitride (SiON), or any material suitable for the formation of spacers. In an exemplary embodiment, thin film layer 30 has a thickness of 100–600 Angstroms. In alternative embodiments, the thickness of thin film layer 30 varies, depending on the amount of shrinking desired. For example, thin film layer 30 may be 100 Angstroms thick to result in a contact shrink of 100 Angstroms (Å) per side (i.e., 200 Å smaller in width). The thickness of thin film layer 30 is important because it determines the spacer width. Thin film layer 30 is etched to form spacers on lateral sides of ARC features 18.

Figure 4:
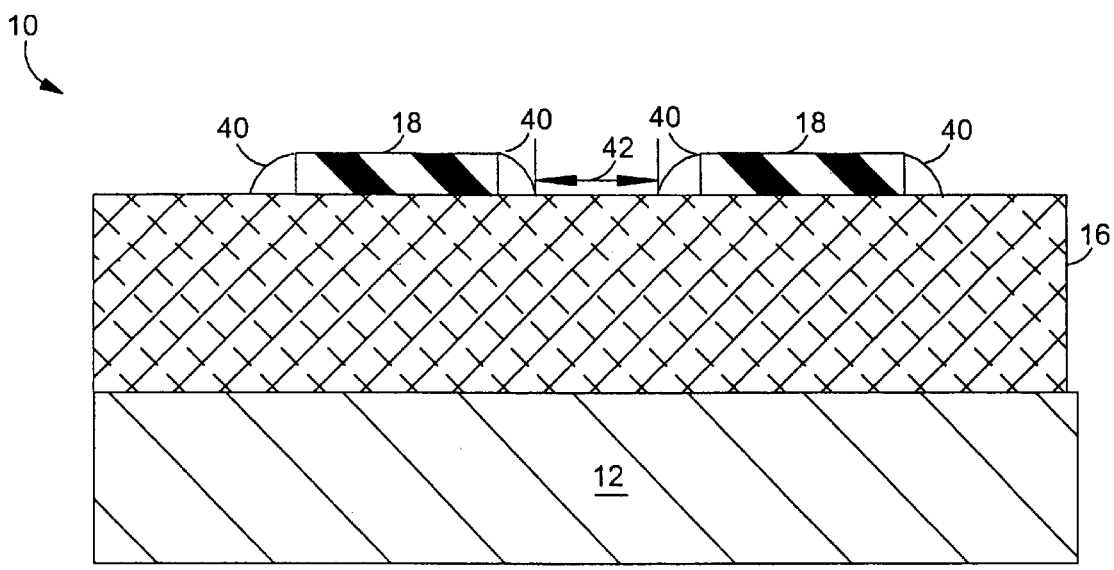
FIG. 4 is a cross-sectional view of a portion of an integrated circuit, showing an exemplary spacer without a tail in an exemplary method of manufacturing the integrated circuit illustrated in FIG. 1.

In FIG. 4, a cross-sectional view of portion 10 illustrates exemplary spacers 40 which result from the etching of thin film layer 30 (described with reference to FIG. 3). Spacers 40 are formed using an etch chemistry which results in a spacer structure without a tail. Etching techniques that can be used include plasma etch and dry etch. In an exemplary embodiment, spacers 40 have a width of 100–600 Angstroms. Spacers 40 and ARC features 18 can serve as a hard mask to form a contact hole in dielectric layers 16. A hard mask is a material with a high etching resistance and is used to "mask" or cover material which is intended not to be etched or removed. Advantageously, the addition of spacers 40 results in a distance 42 which becomes the critical dimension for the contact hole in dielectric layers 16. In an exemplary embodiment, distance 25 (FIG. 2) is 1600–2500 Angstroms. Distance 42 can be as small as 400–1300 Angstroms.

Figure 5:
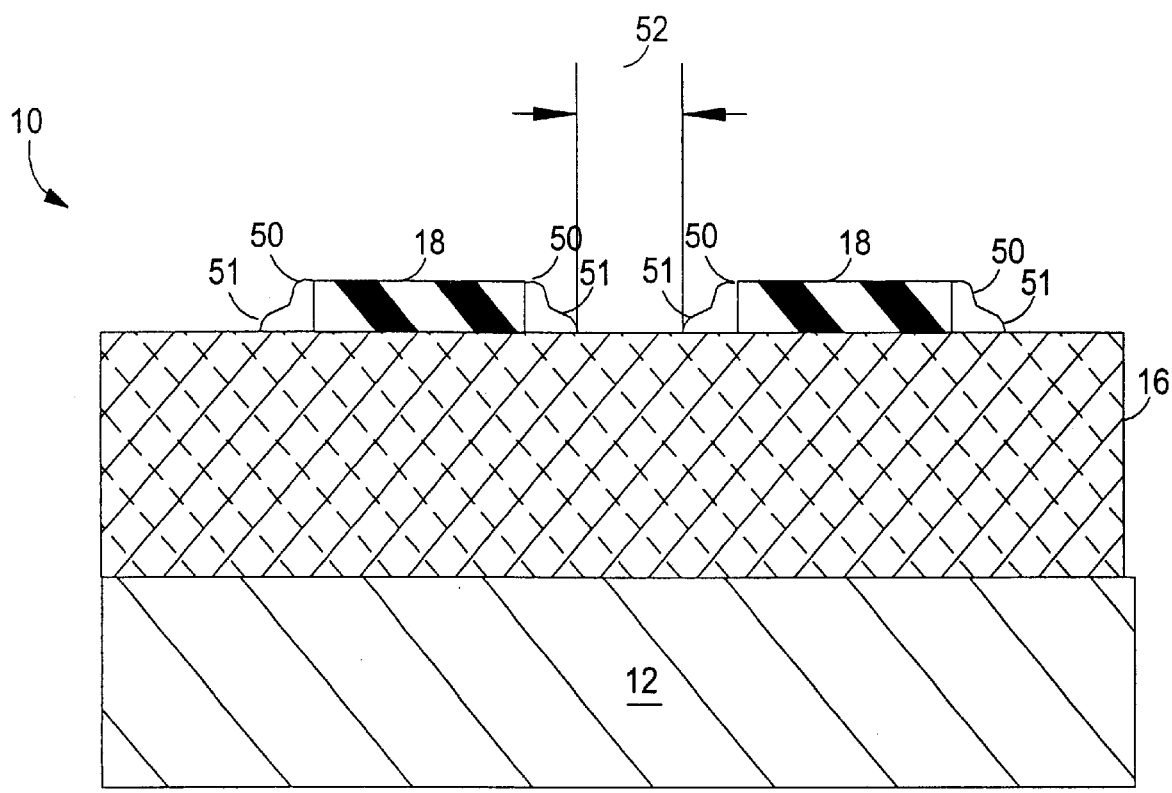
FIG. 5 is a cross-sectional view of a portion of an integrated circuit, showing an exemplary spacer with a tail in an exemplary method of manufacturing the integrated circuit illustrated in FIG. 1.

In FIG. 5, a cross-sectional view of portion 10 illustrates spacers 50 which result from the etching of thin film layer 30 (described with reference to FIG. 3). Spacers 50 are formed using an etch chemistry which results in a spacer structure with a tail 51. Etching techniques that can be used include plasma etch. In an exemplary embodiment, spacers 50 have a width of 100–600 Angstroms. In an exemplary embodiment, the tail portion of spacers 50 has a width of between 50 and 100 Angstroms (Å). The width of tail 51 depends on etching technologies used. For example, high nitride to oxide selectivity etch process can be utilized using heavy polymer deposited dielectric gas such as $CH_3F$ and $CH_2F_2$. Spacers 50 and ARC features 18 can serve as a hard mask to form a contact hole in dielectric layers 16. Advantageously, the addition of spacers 50 results in a distance 52 which becomes the critical dimension for the contact hole in dielectric layers 16. In an exemplary embodiment, distance 52 is 1300–2200 Angstroms. Alternatively, distance 52 can be as small as 200–900 Angstroms.

Referring again to FIG. 1, contact hole 14 is created using spacers 20 and ARC features 18 as a hard mask. An etching process is used to create contact hole 14. In an exemplary embodiment, a plasma etch is used. Alternatively, other etch technologies may be utilized. Advantageously, by adjusting the etch chemistry, spacers 20 can be formed as part of the hard mask, thus allowing the formation of a narrower spacing for contact hole 14. Various spacer etch chemistries can be used to control the size of the spacer formed. For example, spacers 20 can be formed which include a tail.

Advantageously, the use of ARC features 18 and spacers 20 results in smaller critical dimensions for contacts formed within contact hole 14. Further, the method described with reference to FIGS. 1–5 avoids the feature size limitations inherent to conventional lithography.

While the embodiments illustrated in the FIGURES and described above are presently preferred, it should be understood that these embodiments are offered by way of example only. Other embodiments may include, for example, different methods of patterning or etching various layers as well as different methods of creating spacers 20. The invention is not limited to a particular embodiment, but extends to various modifications, combinations, and permutations that nevertheless fall within the scope and spirit of the appended claims.

What is claimed is:

1. A method of forming a contact in an integrated circuit comprising:

providing a photoresist pattern over an anti-reflective coating (ARC) layer, the ARC layer being deposited over a layer of material;

etching the ARC layer according to the photoresist pattern to form ARC features;

forming spacers on lateral sides of the ARC features; and etching a contact hole using the spacers and ARC features as hard mask to define portions of the layer of material which are etched.

2. The method of claim 1, wherein the step of forming spacers comprises adjusting etch chemistry to form spacers with tails.

3. The method of claim 2, wherein the tails are 50-100 Angstroms in width.

4. The method of claim 1, wherein the step of forming spacers comprises adjusting etch chemistry to form spacers without tails.

5. The method of claim 1, wherein the trench lines have a width of 1600–2500 Angstroms.

6. The method of claim 1, further comprising stripping the photoresist pattern.

7. The method of claim 1, wherein the step of forming spacers comprises controlling the shape of the formed spacer.

8. A method of manufacturing an integrated circuit comprising:

patterning mask features on an anti-reflective coating (ARC) layer, the mask features being separated by a first distance defined as a first critical dimension;

transferring the patterned mask features to the ARC layer to form ARC features;

depositing a layer of spacer material over the ARC features;

etching the layer of spacer material to form spacers on lateral sides of the ARC features, the spacers and ARC features defining re-structured ARC features, the re-structured ARC features being separated by a second distance defined as a second critical dimension, the second critical dimension being less than the first critical dimension; and etching contact holes using re-structured ARC features as a hard mask.

9. The method of claim 8, further comprising adjusting spacer etch chemistry to form spacers with tails.

10. The method of claim 8, wherein ARC layer is any one of SiON, SiN, and SiRN.

11. The method of claim 8, wherein the layer of spacer material is any one of SiON, SiN, and SiRN.

12. The method of claim 8, wherein the ARC layer is deposited over a layer of oxide.

13. The method of claim 8, wherein the ARC layer is 300–1000 Angstroms thick.

* * * * *